(12) United States Patent
Zhang et al.

(10) Patent No.: US 8,509,959 B2
(45) Date of Patent: Aug. 13, 2013

(54) SYSTEM AND METHOD FOR PREDICTING TRANSIENT COOLING PERFORMANCE FOR A DATA CENTER

(75) Inventors: Xuanhang Zhang, Tewksbury, MA (US); James W. VanGilder, Pepperell, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 329 days.

(21) Appl. No.: 12/855,209

(22) Filed: Aug. 12, 2010

(65) Prior Publication Data

US 2012/0041569 A1 Feb. 16, 2012

(51) Int. Cl.
*G05D 23/00* (2006.01)
*G06F 1/32* (2006.01)
*H05K 7/20* (2006.01)

(52) U.S. Cl.
CPC .................................. *H05K 7/20836* (2013.01)
USPC ............................ 700/299; 713/323; 454/184

(58) Field of Classification Search
USPC ................... 700/17, 295, 299, 300; 454/184; 429/434; 703/13, 18; 713/310, 320, 323, 713/324; 236/49.3; 718/102–104; 702/61, 702/62
See application file for complete search history.

(56) References Cited

U.S. PATENT DOCUMENTS

| | | | |
|---|---|---|---|
| 4,823,290 A | 4/1989 | Fasack et al. | |
| 5,095,712 A | 3/1992 | Narreau | |
| 5,216,623 A | 6/1993 | Barrett et al. | |
| 5,367,670 A | 11/1994 | Ward et al. | |
| 5,410,448 A | 4/1995 | Barker, III et al. | |
| 5,581,478 A | 12/1996 | Cruse et al. | |
| 5,718,628 A | 2/1998 | Nakazato et al. | |
| 5,735,134 A | 4/1998 | Liu et al. | |
| 6,055,480 A | 4/2000 | Nevo et al. | |
| 6,134,511 A | 10/2000 | Subbarao | |
| 6,216,956 B1 | 4/2001 | Ehlers et al. | |
| 6,246,969 B1 | 6/2001 | Sinclair et al. | |
| 6,494,050 B2 | 12/2002 | Spinazzola et al. | |
| 6,574,104 B2 | 6/2003 | Patel et al. | |
| 6,672,955 B2 | 1/2004 | Charron | |
| 6,694,759 B1 | 2/2004 | Bash et al. | |

(Continued)

FOREIGN PATENT DOCUMENTS

| | | |
|---|---|---|
| CN | 1485906 A | 3/2004 |
| WO | 2008144375 A2 | 11/2008 |
| WO | 2009/014893 A1 | 1/2009 |

OTHER PUBLICATIONS

Pakbaznia, E.; Ghasemazar, M.; Pedram, M.;, "Temperature-aware dynamic resource provisioning in a power-optimized datacenter," Design, Automation & Test in Europe Conference & Exhibition (DATE), 2010, vol., no., pp. 124-129, Mar. 8-12, 2010.*

(Continued)

*Primary Examiner* — Dave Robertson
(74) *Attorney, Agent, or Firm* — Lando & Anastasi, LLP

(57) ABSTRACT

A system and method is provided for evaluating the transient cooling performance of a data center. In one version, the method includes receiving input data from a storage device, the input data including data center architecture information and operating data, displaying a model of the data center, performing real-time transient cooling performance calculations for the data center using the input data, and displaying results of the real-time transient cooling performance calculations, wherein the results include a maximum predicted temperature of the data center following a power outage of the data center.

20 Claims, 7 Drawing Sheets

(56) References Cited

U.S. PATENT DOCUMENTS

| | | | |
|---|---|---|---|
| 6,718,277 B2 | 4/2004 | Sharma | |
| 6,745,579 B2 | 6/2004 | Spinazzola et al. | |
| 6,827,142 B2 | 12/2004 | Winkler et al. | |
| 7,020,586 B2 | 3/2006 | Snevely | |
| 7,031,870 B2 | 4/2006 | Sharma et al. | |
| 7,051,946 B2 | 5/2006 | Bash et al. | |
| 7,085,133 B2 | 8/2006 | Hall | |
| 7,148,796 B2 | 12/2006 | Joy et al. | |
| 7,251,547 B2 | 7/2007 | Bash et al. | |
| 7,313,503 B2 | 12/2007 | Nakagawa et al. | |
| 7,315,448 B1 | 1/2008 | Bash et al. | |
| 7,365,973 B2 | 4/2008 | Rasmussen et al. | |
| 7,366,632 B2 | 4/2008 | Hamann et al. | |
| 7,378,165 B2 * | 5/2008 | Brignone et al. | 429/434 |
| 7,403,391 B2 | 7/2008 | Germagian et al. | |
| 7,426,453 B2 | 9/2008 | Patel et al. | |
| 7,472,043 B1 | 12/2008 | Low et al. | |
| 7,558,649 B1 | 7/2009 | Sharma et al. | |
| 7,568,360 B1 | 8/2009 | Bash et al. | |
| 7,596,476 B2 | 9/2009 | Rasmussen et al. | |
| 7,620,480 B2 | 11/2009 | Patel et al. | |
| 7,726,144 B2 | 6/2010 | Larson et al. | |
| 7,799,474 B2 * | 9/2010 | Lyon et al. | 429/428 |
| 7,844,440 B2 * | 11/2010 | Nasle et al. | 703/18 |
| 7,881,910 B2 | 2/2011 | Rasmussen et al. | |
| 7,885,795 B2 | 2/2011 | Rasmussen et al. | |
| 7,975,156 B2 * | 7/2011 | Artman et al. | 713/323 |
| 7,979,250 B2 | 7/2011 | Archibald et al. | |
| 8,155,922 B2 * | 4/2012 | Loucks | 702/182 |
| 8,219,362 B2 | 7/2012 | Shrivastava et al. | |
| 8,249,825 B2 | 8/2012 | VanGilder et al. | |
| 2001/0042616 A1 | 11/2001 | Baer | |
| 2002/0043969 A1 | 4/2002 | Duncan et al. | |
| 2002/0071031 A1 | 6/2002 | Lord et al. | |
| 2002/0149911 A1 | 10/2002 | Bishop et al. | |
| 2003/0115000 A1 | 6/2003 | Bodas | |
| 2003/0115024 A1 | 6/2003 | Snevely | |
| 2003/0158718 A1 | 8/2003 | Nakagawa et al. | |
| 2004/0020224 A1 | 2/2004 | Bash et al. | |
| 2004/0065097 A1 | 4/2004 | Bash et al. | |
| 2004/0065104 A1 | 4/2004 | Bash et al. | |
| 2004/0075984 A1 | 4/2004 | Bash et al. | |
| 2004/0089011 A1 | 5/2004 | Patel et al. | |
| 2004/0189161 A1 | 9/2004 | Davis et al. | |
| 2004/0240514 A1 | 12/2004 | Bash et al. | |
| 2004/0262409 A1 | 12/2004 | Crippen et al. | |
| 2005/0023363 A1 | 2/2005 | Sharma et al. | |
| 2005/0267639 A1 | 12/2005 | Sharma et al. | |
| 2006/0080001 A1 | 4/2006 | Bash et al. | |
| 2006/0096306 A1 | 5/2006 | Okaza et al. | |
| 2006/0115586 A1 | 6/2006 | Xing et al. | |
| 2006/0214014 A1 | 9/2006 | Bash et al. | |
| 2007/0038414 A1 | 2/2007 | Rasmussen et al. | |
| 2007/0078635 A1 | 4/2007 | Rasmussen et al. | |
| 2007/0121295 A1 | 5/2007 | Campbell et al. | |
| 2007/0171613 A1 | 7/2007 | McMahan et al. | |
| 2007/0174024 A1 | 7/2007 | Rasmussen et al. | |
| 2007/0190919 A1 | 8/2007 | Donovan et al. | |
| 2007/0274035 A1 | 11/2007 | Fink et al. | |
| 2008/0041076 A1 | 2/2008 | Tutunoglu et al. | |
| 2008/0104985 A1 | 5/2008 | Carlsen | |
| 2008/0174954 A1 | 7/2008 | VanGilder et al. | |
| 2008/0180908 A1 | 7/2008 | Wexler | |
| 2009/0030554 A1 | 1/2009 | Bean, Jr. et al. | |
| 2009/0138313 A1 | 5/2009 | Morgan et al. | |
| 2009/0138888 A1 | 5/2009 | Shah et al. | |
| 2009/0150123 A1 | 6/2009 | Archibald et al. | |
| 2009/0223234 A1 | 9/2009 | Campbell et al. | |
| 2009/0259343 A1 | 10/2009 | Rasmussen et al. | |
| 2009/0326879 A1 | 12/2009 | Hamann et al. | |
| 2010/0106464 A1 | 4/2010 | Hlasny et al. | |
| 2010/0256959 A1 | 10/2010 | VanGilder et al. | |
| 2010/0286956 A1 | 11/2010 | VanGilder et al. | |
| 2010/0287018 A1 | 11/2010 | Shrivastava et al. | |
| 2011/0040529 A1 | 2/2011 | Hamann et al. | |
| 2011/0213508 A1 * | 9/2011 | Mandagere et al. | 700/291 |
| 2012/0071992 A1 | 3/2012 | VanGilder et al. | |
| 2012/0158387 A1 | 6/2012 | VanGilder et al. | |
| 2012/0170205 A1 | 7/2012 | Healey et al. | |
| 2012/0221872 A1 * | 8/2012 | Artman et al. | 713/320 |
| 2013/0006426 A1 | 1/2013 | Healey et al. | |

OTHER PUBLICATIONS

Manish Marwah, Ratnesh Sharma, Rocky Shih, Chandrakant Patel, Vaibhav Bhatia, Mohandas Mekanapurath, Rajkumar Velumani, and Sankaragopal Velayudhan. 2009. Data analysis, visualization and knowledge discovery in sustainable data centers. In Proceedings of the 2nd Bangalore Annual Compute Conference (COMPUTE '09).*

Abi-Zadeh, Davar et al., "A Transient Analysis of Environmental Conditions for a Mission Critical Facility after a Failure of Power", Arup Mission Critical Facilities, Feb. 2001, pp. 1-12.

"Case Study, Application of TileFlow to Improve Cooling in a Data Center," Innovative Research, Inc., 2004.

Anderson, Donald, "Iterative Procedures for Nonlinear Integral Equations," Journal of the Association for Computing Machinery, vol. 12, No. 4, Oct. 1965, pp. 547-560.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.

Chandrakant D. Patel, et al., "Thermal Considerations in Cooling Large Scale High Copute Density Data Centers" IEEE 2002, pp. 767-776.

Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.

Ehsan Pakabaznia et al., "Minnimizing data center cooling and server power costs", Proceedings of the 14th ACM/IEEE International Symposium on Low Power Electronics and Design, ISLPED '09, Jan. 1, 2009, p. 145, XP55015368, New York, New York, USA, DOI: 10.1145/1594233.1594268, ISBN: 978-1-60-558684-7.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

International Search Report for PCT/US2006/16739 mailed Oct. 3, 2006.

International Search Report for PCT/US2008/051908 mailed Jul. 3, 2008.

Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, DOI:10.1007/S10619-006-7007-3.

Jeonghwan Choi et al., "A CFD-Based Tool for Studying Temperature in Rack-Mounted Servers", IEEE Transactions on Computers, IEEE Service Center, Los Alamitos, CA, US, vol. 57, No. 8, Aug. 1, 2008, pp. 1129-1142, ISSN: 0018-9340, DOI: 10.1109/TC.2008.52.

K. Dunlap, "Cooling Audit for Identifying Potential Cooling Problems in Data Centers", White Paper #40, pp. 1-18, American Power Conversion, May 20, 2004, published on World Wide Web.

Karki et al., "Techniques for controlling airflow distribution in raised-floor data centers," ASME 2003.

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Refai-Ahmed G. et al., "Analysis of flow distribution in power supply using flow network modeling (FNM)", Thermal and Thermomechanical Phenomena in Electronic Systems, 2000, ITHERM 2000, The Seventh Intersociety Conference on May 23-26, 2000, Piscataway, NJ, USA, IEEE, Piscataway, NJ, USA, vol. 1, May 23, 2000, pp. 90-98, ISBN: 978-0-7803-5912-3.

Sharma, R.K, Bash, C.E, and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.

Shrivastava S.K. et al., "A flow-network model for predicting rack cooling in containment systems", Proceedings of the ASME Interpack Conference—2009: Presented At 2009 ASME Interpack Conference, Jul. 19-23, 2009, San Francisco, California, USA, vol. 2, Jul. 19, 2009, pp. 785-791.

Toulouse M.M. et al., "Exploration of a potential-flow-based compact model of air-flow transport in data centers", Proceedings of the ASME International Mechanical Engineering Congress and Exposition—2009: Presented at 2009 ASME International Mechanical Engineering Congress and Exposition, Nov. 13-19, 2009, Lake Buena Vista, Florida, USA, vol. 13: New Del, vol. 13, Jan. 1, 2009, pp. 41-50, DOI: 10.1115/IMECE2009-10806, ISBN: 978-0-7918-4386-4.

Vanessa Lopez et al., "Measurement-based modeling for data centers", Thermal and Thermomechanical Phenomena in Electronic Systems (ITHERM), 2010 12th IEEE Intersociety Conference on, IEEE, Piscataway, NJ, USA, Jun. 2, 2010, pp. 1-8, XP031702357.

Vangilder et al., "Airflow Uniformity thourhg Perforated Tiles in a Raised-Floor Data Center", White Paper 121, Jul. 17-22, 2005, 10 pages.

Vangilder, James W. et al., "Caputure index: an airflow-based rack cooling performance metric," 2007, ASHRAE Transactions, vol. 113, pp. 126-136.

Vangilder, James W. et al., "Real-Time prediction of rack-cooling performance," 2006, ASHRAE Transactions, vol. 112, pp. 151-162.

* cited by examiner

INPUTS 500

Equipment

| | | |
|---|---|---|
| Total Load | 27,380 kW | Max. Allowable Temp. 90 °F |
| Cooling System | Chilled water | |

Room Geometry  ☐ Plenum

| | | | | |
|---|---|---|---|---|
| Length | 1214 ft | Depth | 24 in | |
| Width | 328 ft | | | |
| Height | 13 ft | Piping and Cabling Density | Typical | |

Coolers
Total Air Flow
- ⦿ Based On Nameplate Capacity: 48,000 kW    7,680,000 cfm
- ○ Specified Airflow    18,000 cfm Cooler Set Point Temp. 60    Typical Water Side ΔT  18 °F

Chiller System

| | |
|---|---|
| Install Chiller Capacity | 38,558 kW |
| Chiller Start Time | 15 min. |
| Initial Chilled Water ΔT | 10 °F |
| Chilled Water Set Point Temp. | 45 °F |

Piping Info.
- ⦿ Volume    50 gal
- ○ Dimentions    Length 500 ft    Inner Diameter 2 in ☑ Supplemental Thermal Storage
Storage Volume  250,000 gal  ◄ ▶
☐ Bypass Storage During Chiller Startup

Power Feeds    Generator Starttime  35.0 sec.

| | UPS | Generator | UPS Runtime (min.) |
|---|---|---|---|
| IT Equipment | ☐ | ☑ | 0.6 ◄ ▶ |
| Cooler Fans | ☐ | ☑ | - ◄ ▶ |
| Chilled Water Pumps | ☐ | ☑ | - ◄ ▶ |
| Chillers | ☐ | ☑ | N/A |

SYSTEM AND METHOD FOR PREDICTING TRANSIENT COOLING PERFORMANCE FOR A DATA CENTER

BACKGROUND OF THE INVENTION

1. Field of the Invention

At least one embodiment in accordance with the present invention relates generally to systems and methods for data center management and design, and more specifically, to systems and methods for predicting transient cooling performance for a data center.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in rows of specialized enclosures termed "racks" which integrate these connectivity, power and cooling elements. In some data center configurations, these rows are organized into hot and cold aisles to decrease the cost associated with cooling the information technology equipment. These characteristics make data centers a cost effective way to deliver the computing power required by many software applications.

Various processes and software applications, such as the InfrastruXure® Central and the Operations Manager product available from American Power Conversion Corporation (APC) of West Kingston, R.I., have been developed to aid data center personnel in designing and maintaining efficient and effective data center configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

BRIEF SUMMARY OF THE INVENTION

A first aspect of the invention is directed to a computer-implemented method for evaluating the transient cooling performance of a data center. The method includes receiving input data from a storage device, the input data including data center architecture information and operating data, displaying a model of the data center, performing real-time transient cooling performance calculations for the data center using the input data, and displaying results of the real-time transient cooling performance calculations, wherein the results include a maximum predicted temperature of the data center following a power outage of the data center and/or the cooling run time.

In the method, the results may include a graphical representation of data center temperature verses time for a time period following the power outage of the data center. The method may further include comparing the maximum predicted temperature of the data center with a threshold to obtain a comparison result, and controlling at least one device in the data center based on the comparison result. The method may further include comparing the maximum predicted temperature of the data center with a threshold to obtain a comparison result, altering design parameters of the data center based on the comparison result, and performing a second iteration of real-time transient cooling performance calculations using the altered design parameters. The method may also further include detecting a change in at least one cooling parameter in the data center, and performing a second iteration of real-time transient cooling performance calculations using the at least one cooling parameter. The method may include comparing the maximum predicted temperature of the data center with a threshold to obtain a comparison result, and providing a warning to an operator based on the comparison result. In the method, performing real-time transient cooling performance calculations for the data center may include developing a set of energy balance and heat transfer linear equations for the data center based on the input data, and generating a symbolic expression for each of a plurality of temperature variables in the set of energy balance linear equations. The data center may include at least one uninterruptible power supply, and the method may further include altering a connection of cooling equipment to the uninterruptible power supply based on the comparison result.

Another aspect of the invention is directed to a system for evaluating transient cooling performance of a data center. The system includes a storage device, a display, a controller coupled to the storage device and the display and configured to receive input data from the storage device, the input data including data center architecture information and operating data, display a model of the data center on the display, perform real-time transient cooling performance calculations for the data center using the input data, and control the display to display results of the real-time transient cooling performance calculations, wherein the results include a maximum predicted temperature of the data center following a power outage of the data center.

In the system, the displayed results may include a graphical representation of data center temperature verses time for a time period following the power outage of the data center. The controller may be further configured to compare the maximum predicted temperature of the data center with a threshold to obtain a comparison result, and control at least one device in the data center based on the comparison result. The controller may also be configured to compare the maximum predicted temperature of the data center with a threshold to obtain a comparison result, alter design parameters of the data center based on the comparison result, and perform a second iteration of real-time transient cooling performance calculations using the altered design parameters. The controller may be further configured to detect a change in at least one cooling parameter in the data center, and perform a second iteration of real-time transient cooling performance calculations using the at least one cooling parameter. The controller may be further configured to compare the maximum predicted temperature of the data center with a threshold to obtain a comparison result, and provide a warning to an operator based on the comparison result. The controller may also be configured to perform real-time transient cooling performance calculations for the data center by developing a set of energy balance and heat transfer linear equations for the data center based on the input data, and generating a symbolic expression for each of a plurality of temperature variables in the set of energy balance linear equations.

Another aspect of the invention is directed to a computer readable medium having stored thereon sequences of instruction including instructions that will cause a processor to receive input data regarding a layout of a data center and cooling systems contained in the data center, store the input data, control a display to display a model of the data center, perform real-time transient cooling performance calculations for the data center using the input data, and control a display to display results of the real-time transient cooling performance calculations.

The computer readable medium may further include instructions that will cause the processor to determine a maximum temperature of the data center following a power outage. The sequences of instruction may further include instructions that will cause the processor to compare the maximum predicted temperature of the data center with a threshold to obtain a comparison result, and control at least one device in the data center based on the comparison result. The sequences of instruction may also include instructions that will cause the processor to compare the maximum predicted temperature of the data center with a threshold to obtain a comparison result, alter design parameters of the data center based on the comparison result, and perform a second iteration of real-time transient cooling performance calculations using the altered design parameters. The sequences of instruction may further include instructions that will cause the processor to compare the maximum predicted temperature of the data center with a threshold to obtain a comparison result, and provide a warning to an operator based on the comparison result.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5 shows an input screen that may be used in conjunction with a computer system in accordance with one embodiment;

DETAILED DESCRIPTION OF THE INVENTION

Figure 1:
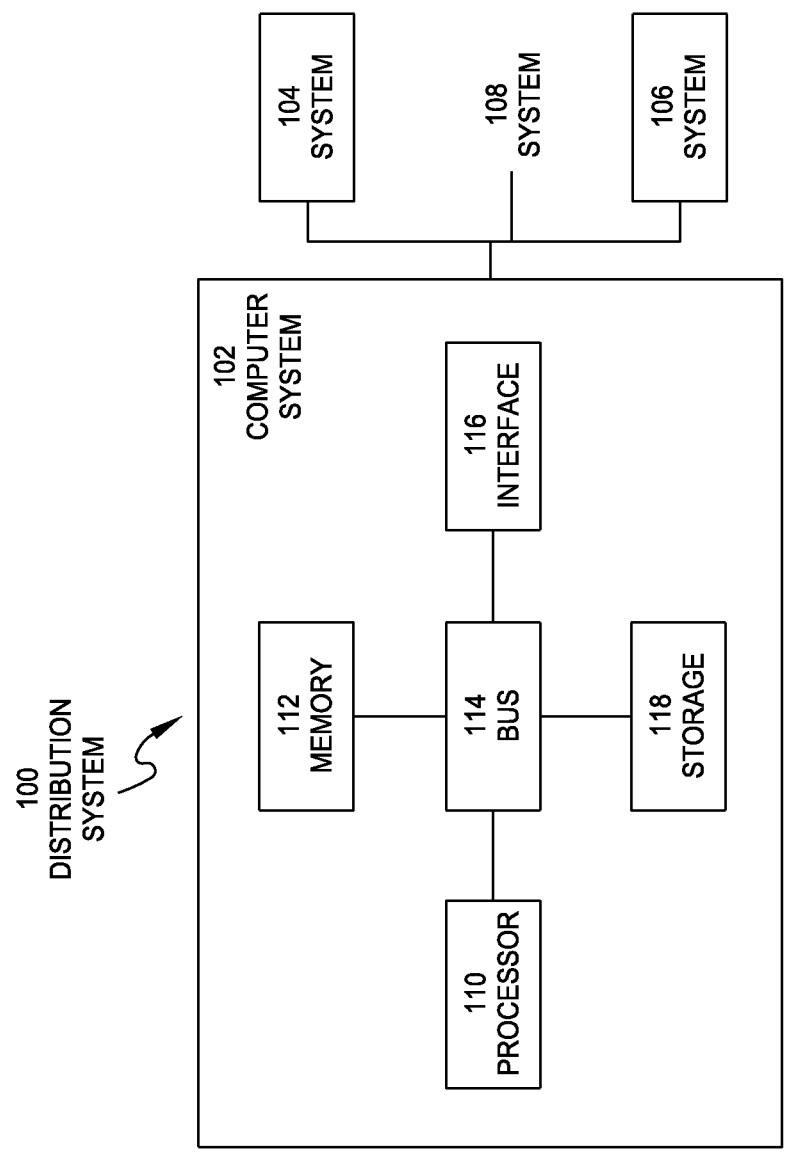
FIG. 1 shows an example computer system with which various aspects in accord with the present invention may be implemented.

At least some embodiments in accordance with the present invention relate to systems and processes through which a user may design new data center configurations and analyze, modify, manage and control existing configurations. These systems may facilitate this activity by allowing the user to create models of data center configurations from which performance metrics may be determined. Both the systems and the user may employ these performance metrics to determine alternative data center configurations that meet various design objectives. Further, in at least one embodiment, a system provides transient cooling predictions in real time for a proposed layout of data center equipment and also provides transient cooling analysis for an installed data center.

As described in U.S. patent application Ser. No. 12/019, 109, titled "System and Method for Evaluating Equipment Rack Cooling", filed Jan. 24, 2008 (referred to herein as "the '109 application"), and in U.S. patent application Ser. No. 11/342,300, titled "Methods and Systems for Managing Facility Power and Cooling" filed Jan. 27, 2006 (referred to herein as "the '300 application"), both of which are assigned to the assignee of the present application, and both of which are hereby incorporated herein by reference in their entirety, typical equipment racks in modern data centers draw cooling air in the front of the rack and exhaust air out the rear of the rack. The equipment racks, and in-row coolers are typically arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool aisle cluster, and adjacent rows of equipment racks separated by a hot aisle may be referred to as a hot aisle cluster. As readily apparent to one of ordinary skill in the art, a row of equipment racks may be part of one hot aisle cluster and one cool aisle cluster. In descriptions and claims herein, equipment in racks, or the racks themselves, may be referred to as cooling consumers, and in-row cooling units and/or computer room air conditioners (CRACs) may be referred to as cooling providers. In the referenced applications, tools are provided for analyzing the cooling performance of a cluster of racks in a data center. In these tools, multiple analyses may be performed on different layouts to attempt to optimize the cooling performance of the data center.

The tools described in the referenced applications are effective in analyzing steady state cooling performance of data centers. The transient cooling performance of a data center is also critical. In a typical data center, electrical power supply to a data center is typically supported by uninterruptible power supplies (UPS) and emergency generators with specified redundancy levels to ensure uninterruptible computing. However, in most data centers the cooling system will shut down at least for a short period of time upon power interruption, and sensitive powered electronics may become overheated. In critical data centers, generators are often used for powering electronics as well as cooling systems during extended power outages, but there is typically still a period of time between the power outage, and the start-up of a generator, when electronics are operating from a UPS, that the cooling system may be shut down.

In prior systems, facility temperature changes during a cooling outage, and even when the cooling initially comes back on, are typically not addressed, although the problem has been recognized for some time as discussed in "A Transient Analysis of Environmental Conditions for a Mission Critical Facility after a Failure of Power," Davar Abi-Zadeh and Peter Samain, February 2001. In at least some embodiments described herein, transient cooling performance of a data center's cooling system is analyzed based on the stored cooling capacity of the cooling system. The system stored cooling capacity is affected by a number of factors including power connections between fans and any UPS's and between chilled water pumps and UPS's, data center room architecture and characteristics and also the size of the data center's chilled water storage tanks. In embodiments of the invention, methods and tools are provided that allow a user to estimate the stored cooling capacity and the cooling runtime for a mission critical facility. These tools and methods may be used in conjunction with both data center design tools and with data center management tools.

The aspects disclosed herein in accordance with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments of the data center may be used to automatically measure environmental parameters in a data center, and control equipment, such as chillers or coolers to optimize performance. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accordance with the present invention may be implemented within methods, acts, systems, system elements and components using a variety of hardware and software configurations, and the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any storage device for storing data, such as a disk drive or other non-volatile storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accordance with the present invention may be practiced, aspects of the invention are not limited to being implemented on the computer system as shown in FIG. 1. Various aspects and functions in accord with the present invention may be practiced on one or more computers having different architectures or components than that shown in FIG. 1. For instance, computer system 102 may include specially-programmed, special-purpose hardware, such as for example, an application-specific integrated circuit (ASIC) tailored to perform a particular operation disclosed herein, while another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C–, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used. Further, in at least one embodiment, the tool may be implemented using VBA Excel.

A computer system included within an embodiment may perform additional functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
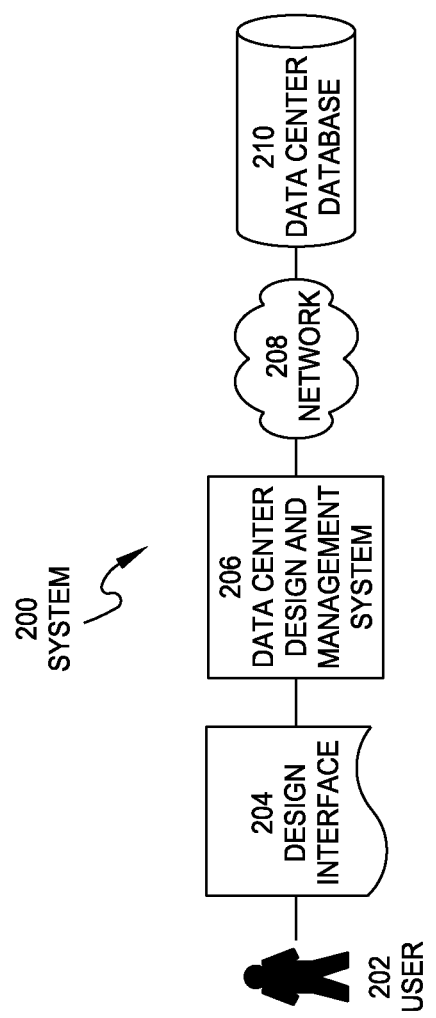
FIG. 2 illustrates an example distributed system including an embodiment.

FIG. 2 presents a context diagram including physical and logical elements of distributed system 200. As shown, distributed system 200 is specially configured in accordance with the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 includes user 202, interface 204, data center design and management system 206, communications network 208 and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, interface 204 may be implemented with specialized facilities that enable user 202 to design, in a drag and drop fashion, a model that includes a representation of the physical layout of a data center or any subset thereof. This layout may include representations of data center structural components as well as data center equipment. The features of interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store types of cooling providers, the amount of cool air provided by each type of cooling provider, and a temperature of cool air provided by the cooling provider. Thus, for example, data center database 210 includes records of a particular type of CRAC unit that is rated to deliver airflow at the rate of 5,600 cfm at a temperature of 68 degrees Fahrenheit. In addition, the data center database 210 may store one or more cooling metrics, such as inlet and outlet temperatures of the CRACs and inlet and outlet temperatures of one or more equipment racks. The temperatures may be periodically measured and input into the system, or in other embodiments, the temperatures may be continuously monitored using devices coupled to the system 200.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. Further, the system in FIG. 2 may also connect to one or more devices in a data center, including components of the cooling system or power distribution system to control and monitor these systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, embodiments of the invention are not limited to a specific number of users or systems.

In at least one embodiment, which will now be described, a tool is provided that predicts in real-time transient cooling performance for a data center. The tool utilizes novel methods of modeling a data center and simplifying analysis of the models to predict real-time transient cooling performance. The ability to predict performance in real-time allows the tool to be used to quickly analyze several possible solutions and consider various trade-offs. As discussed further below, the tool can be used as a stand-alone trade-off tool, incorporated in a data center design system, or incorporated as part of a data center management system such as APC's InfrastruXure® Central product discussed above.

In describing embodiments of the invention, it is helpful to start with a description of a data center transient model used with some embodiments. In the model, a typical chilled water cooled data center may be considered as consisting of three loops: one air-side loop and two water side loops. In the air-side loop, cooled air supplied by coolers enters the room (or plenum, then to the room) and mixes with hot air from server exhaust and is heated by the heat load. The airflow is assumed to be fully mixed inside the data center room before it leaves through the cooler returns.

The chilled water system has two loops. The first is a loop between the chiller plants and the coolers in the room. The chilled water is supplied from chillers by pumps that circulate water through a network of pipes. The chilled water first enters a storage tank, where a certain volume of chilled water is stored to serve as a source of cooling during power failure, and the chilled water then flows through cooling coils of each cooler in the room. A portion of chilled water may also bypass the cooling coils for control purposes. These two streams of water are mixed together before the water returns to the chillers.

Figure 3:
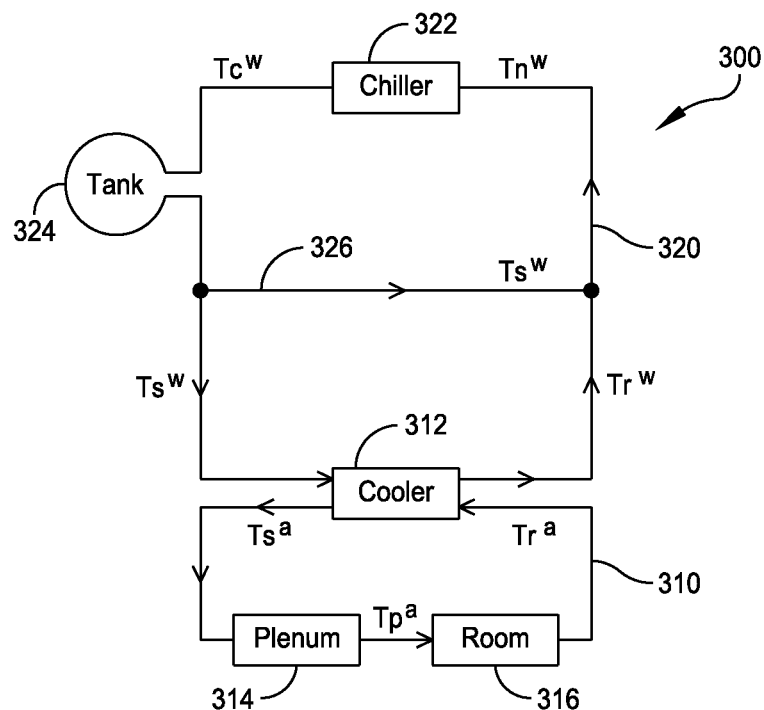
FIG. 3 shows a model of a cooling system in a first data center.

The second loop of the chilled water system includes circulation between the chillers and cooling towers. In at least one model used herein, the second loop is not considered. A model 300 depicting the air flow and the water flow in the first loop 310 and the second loop 320 for a predominant in-room cooling architecture with a raised floor plenum is shown in FIG. 3. In FIG. 3, the first loop 310 includes a cooler 312, which includes all the coolers in the system, a plenum 314 and the data center room 316. Air from the cooler 312 having a temperature $T_s^a$ passes from the cooler 312 to the plenum 314 and mixes with air in the plenum and the temperature of the fully mixed air in the plenum is $T_p^a$. The air from the plenum passes through perforated floor tiles and through various leakage paths into the room 316 mixing with the air in the room resulting in fully mixed room air having a temperature $T_r^a$. The fully mixed room air returns to the cooler.

In the model 300 of FIG. 3, the second loop includes a chiller 322, a tank 324, the cooler 312 and a bypass line 326. Chilled water from the chiller 322 having a temperature $T_c^w$ enters the tank 324, and water from the storage tank having a temperature $T_s^w$ passes to the bypass line 326 and to the cooler 212. Return water from the cooler having a temperature $T_r^w$ mixes with the water from the bypass line and returns to the chiller. The temperature of the water to the chiller is $T_h^w$.

For one embodiment that will now be described, energy balance equations can be derived for the data center room, cooler and the chilled water system based on the model shown in FIG. 3. Equation (1) is an energy balance equation for the room.

$$\dot{Q}_{IT} + \dot{m}^a c_p^a T_p^a = \dot{m}^a c_p^a T_r^a + h_E A_E (T_r^a - T_E) + \rho^a c_p^a V_R \frac{dT_r^a}{dt} \quad (1)$$

where
$\dot{Q}_{IT}$ dot is the total load in the data center
$\dot{m}^a$ dot is the mass flow rate of cooler supply air
$c_p^a$ is the specific heat of air
$T_p^a$ is the fully mixed plenum air temperature
$T_r^a$ is the fully mixed room air temperature
$h_E$ is the convection heat transfer coefficient between the equipment and air in the room
$A_E$ is the total exposed surface area of the equipment
$T_E$ is the equipment surface temperature
$\rho^a$ is the density of air
$V_R$ is the volume of the air in the room
t is time Note that this equation can be extended to include other room characteristics such as walls, windows, ceiling, and other solid surfaces, which are capable to behave as heat sinks to perform heat exchange with air.

For the data center room, the rate of change of room temperature is approximated using Equation (2).

$$\frac{dT_r^a}{dt} \approx \frac{T_r^a - T_r^{a*}}{\Delta t} \quad (2)$$

where
$\Delta t$ is a small time interval
$T_r^{a*}$ is the room air temperature before the time interval $\Delta t$
$T_r^a$ is the room air temperature after the time interval $\Delta t$ Similarly, for equipment contained in the data center, Equation (3) demonstrates the heat transfer between the equipment and the room air.

$$(Mc)_E \frac{dT_E}{dt} = (Mc)_E \frac{T_E - T_E^*}{\Delta t} = h_E A_E (T_r^a - T_E) \quad (3)$$

where
$(Mc)_E$ is the mass times specific heat of the equipment
$T_E^*$ is the equipment surface temperature before the time interval $\Delta t$
$T_E$ is the equipment surface temperature after the time interval $\Delta t$ Equation (4) provides an energy balance equation for the plenum.

$$\dot{m}^a c_p^a T_s^a = \dot{m}^a c_p^a T_p^a + h_B A_B (T_p^a - T_B) + \rho c_p^a V_P \frac{dT_p^a}{dt} \quad (4)$$

where
$T_s^a$ is the cooler supply air temperature
$h_B$ is the convection heat transfer coefficient between the plenum obstruction, such as concrete slabs and chilled water pipes and air
$A_B$ is the total surface area of the plenum obstruction $T_B$ is the plenum obstruction surface temperature
$V_p$ is the volume of the air in the plenum The rate of change of plenum temperature is approximated by:

$$\frac{dT_p^a}{dt} \approx \frac{T_p^a - T_p^{a*}}{\Delta t} \quad (5)$$

where
$T_p^{a*}$ is the plenum air temperature before the time interval $\Delta t$
$T_p^a$ is the plenum air temperature after the time interval $\Delta t$ A typical raised floor air plenum has a number of obstructions that can, in addition to impeding air flow, can provide significant thermal mass. Equation (6) represents an energy balance equation for these obstructions.

$$(Mc)_B \frac{dT_B}{dt} \approx (Mc)_B \frac{T_B - T_B^*}{\Delta t} = h_B A_B (T_p^a - T_B) \quad (6)$$

where
$(Mc)_B$ is the mass times specific heat of the plenum obstruction
$T_B^*$ is the plenum obstruction surface temperature before the time interval $\Delta t$
$T_B$ is the plenum obstruction surface temperature after the time interval $\Delta t$ An energy balance equation can also be derived for the heat exchangers in the coolers. From the Log Mean Temperature Differential (LMTD) heat exchanger model, a well known heat exchanger design metric the performance of the coolers can be characterized using Equation (7).

$$\frac{T_r^a - T_r^w}{T_s^a - T_s^w} = \exp\left[AUf\left(\frac{1}{\dot{m}^a c_p^a} - \frac{1}{\dot{m}^w c_p^w}\right)\right] \quad (7)$$

where
$T_r^w$ is the temperature of water flow leaving the coolers
$T_s^w$ is the temperature of water flow entering the coolers
A is the total coil surface area
U is the overall U value of the coils in the coolers
f is the heat exchanger coefficient
$\dot{m}^w$ is the mass flow rate of water entering the coolers
$c_p^w$ is the specific heat of water Further, since the total load removed by the coolers should be equal to the total load in the data center, Equation (8) is satisfied to maintain energy balance in the data center room.

$$\dot{Q}_{IT} = \dot{m}^a c_p^a (T_r^a - T_s^a) = \dot{m}^w c_p^w (T_r^w - T_s^w) \quad (8)$$

Equation (9) represents an energy balance equation for the chiller system.

$$\dot{M}^w c_p^w T_h^w = \dot{M}^w c_p^w T_c^w + \dot{Q}_{chiller} \quad (9)$$

where
$\dot{M}^w$ is the chiller water flow rate
$T_h^w$ is the temperature of the water flow entering the chillers
$T_c^w$ is the temperature of the water flow leaving the chillers
$\dot{Q}_{chiller}$ is the total cooling load provided by chillers or other refrigeration units Under normal steady-state operating conditions, this should be equal to the total load in the data center room.

However, the total cooling load is a function of time during chiller restart and depends on factors such as the loading schedule.

Equation (10) represents the energy balance equation for the chilled water storage tank.

$$\dot{M}^w c_p^w T_c^w = \dot{M}^w c_p^w T_s^w + M_{storage} c_p^w \frac{dT_s^w}{dt} \quad (10)$$

where $M_{storage}$ is the total mass of the chilled water buffer storage

The rate of change of the cooler entering water temperature can be approximated using Equation (11).

$$\frac{dT_s^w}{dt} \approx \frac{T_s^w - T_s^{w*}}{\Delta t} \quad (11)$$

where $T_s^{w*}$ is the temperature of water flow entering the coolers before the time interval $\Delta t$ $T_s^w$ is the temperature of water flow entering the coolers after the time interval $\Delta t$ The transient characteristics of the water in the return pipe can also be expressed in a similar way as that in equation (10). In at least one embodiment, since the volume of the piping system is relatively negligible comparing to the volume of the water storage tank this effect is ignored to simplify the process.

Finally, for the chilled water system, the energy balance on all water in the piping loops can be expressed as shown in Equation (12).

$$T_s^w (\dot{M}^w - \dot{m}^w) c_p^w + T_r^w \dot{m}^w c_p^w = T_h^w \dot{M}^w c_p^w \quad (12)$$

Combinations and substitutions can reduce the above 12 equations to a set of nine linear equations. More specifically, substituting equation (2) into (1), (5) into (4), and (11) into (10), results in a set of nine linear equations, with nine unknowns: $T_p^a, T_r^a, T_E, T_s^a, T_B, T_r^w, T_s^w, T_h^w$, and $T_c^w$.

The set of linear equations can be expressed in the form of a matrix as shown below:

$$\begin{bmatrix} x_{11} & x_{12} & x_{13} & 0 & 0 & 0 & 0 & 0 & 0 \\ 0 & x_{22} & x_{23} & 0 & 0 & 0 & 0 & 0 & 0 \\ x_{33} & 0 & 0 & x_{34} & x_{35} & 0 & 0 & 0 & 0 \\ x_{44} & 0 & 0 & 0 & x_{45} & 0 & 0 & 0 & 0 \\ 0 & x_{52} & 0 & x_{54} & 0 & x_{56} & x_{57} & 0 & 0 \\ 0 & x_{62} & 0 & x_{64} & 0 & x_{66} & x_{67} & 0 & 0 \\ 0 & 0 & 0 & 0 & 0 & 0 & 0 & x_{78} & x_{79} \\ 0 & 0 & 0 & 0 & 0 & 0 & x_{87} & 0 & x_{89} \\ 0 & 0 & 0 & 0 & 0 & x_{96} & x_{97} & x_{98} & 0 \end{bmatrix} \begin{bmatrix} T_p^a \\ T_r^a \\ T_E \\ T_s^a \\ T_B \\ T_r^w \\ T_s^w \\ T_h^w \\ T_c^w \end{bmatrix} = \begin{bmatrix} y_1 \\ y_2 \\ y_3 \\ y_4 \\ y_5 \\ y_6 \\ y_7 \\ y_8 \\ y_9 \end{bmatrix}$$

In the matrix, all the $x_{ij}$ and $y_{ij}$ values can be obtained from user inputs and/or constants together with temperature values from the previous time step. Constants A, U, and f of equation (7) can be treated as a single value. $\Delta t$ can be either a fixed constant for each time step, or take on different values for different time periods during the analysis.

In different embodiments, one of two approaches may be used to solve these nine temperatures for each time step. The first approach is to solve the temperature vector symbolically offline using one of a number of commercially available mathematics software tools (for example, Woframe Research's Mathematica Software). After the symbolic expression of each temperature variable is obtained, the temperature values for each time step can be computed by plugging in all the user input constants, the time steps, and, in some cases, previously calculated temperature values (for example equation (2), (5), and (11)).

The second approach to calculate the transient temperature values is to utilize software code designed to solve the particular equations. In the code, for each time step, a solver (for example, a linear solver using Gaussian elimination method) is called to solve the nine equations simultaneously to obtain all the nine temperature values for that particular time step. The code is configured to repeat the solving process for all the time intervals until the end, which is either specified or determined based on parameters designed into the software code.

The above described process provides a simplified model for determining transient temperature performance in a data center having a predominantly in-room cooling architecture. As will now be described, in another embodiment, a simper modeling process and analysis can be used for a predominantly in-row cooling architecture.

Figure 4:
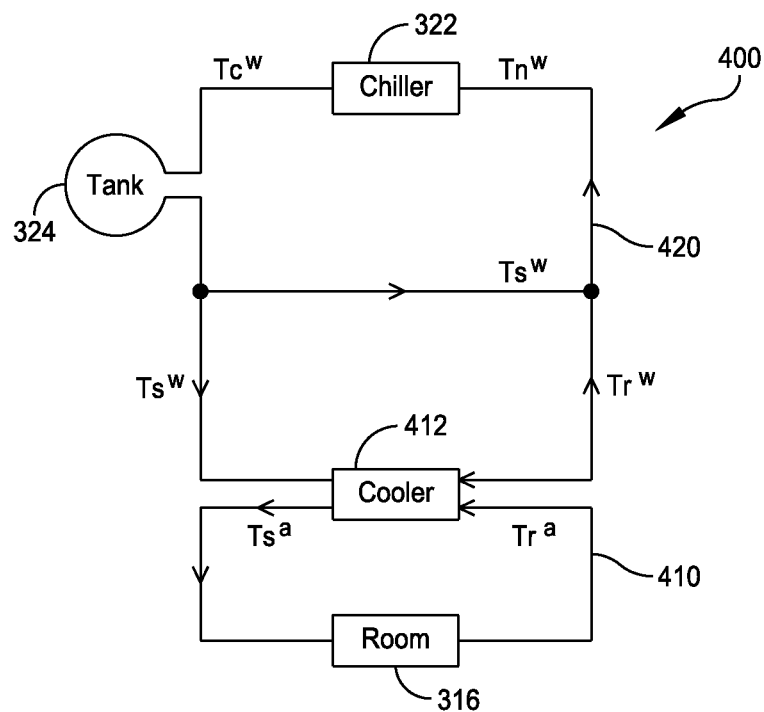
FIG. 4 shows a model of a cooling system in a second data center.

FIG. 4 shows a model 400 of a data center with predominantly in-row cooling. Two cooling loops 410 and 420 are included in the model. The model 400 is similar to the model 300 except that the model 400 does not include a plenum. Common elements of the model 400 to model 300 are labeled with the same reference number with the exception of the cooler 312 of model 300 is replaced by a cooler 412 in model 400, recognizing that the room cooler of model 300 is replaced by in row cooling in model 400.

The model 400 can be analyzed in a manner similar to model 300 described above, except that Equations (4), (5) and (6) need not be included in the analysis reducing the number of linear equations to be solved to 7. The seven equations can be represented in matrix form as shown below.

$$\begin{bmatrix} x_{11} & x_{12} & x_{13} & 0 & 0 & 0 & 0 \\ x_{21} & x_{22} & 0 & 0 & 0 & 0 & 0 \\ x_{31} & 0 & x_{33} & x_{34} & x_{35} & 0 & 0 \\ x_{41} & 0 & x_{43} & x_{44} & x_{45} & 0 & 0 \\ 0 & 0 & 0 & 0 & 0 & x_{56} & x_{57} \\ 0 & 0 & 0 & 0 & x_{65} & 0 & x_{67} \\ 0 & 0 & 0 & x_{74} & x_{75} & x_{76} & 0 \end{bmatrix} \begin{bmatrix} T_r^a \\ T_E \\ T_s^a \\ T_r^w \\ T_s^w \\ T_h^w \\ T_c^w \end{bmatrix} = \begin{bmatrix} y_1 \\ y_2 \\ y_3 \\ y_4 \\ y_5 \\ y_6 \\ y_7 \end{bmatrix}$$

The matrix may be solved in a manner similar to the matrix described above involving nine equations.

The transient cooling performance model and procedures described above can be implemented in a number of applications as will now be described.

In one embodiment, a process and stand-alone tool are provided that enable a user to manually input information into the tool, and a computer system having one of the architectures described above may be programmed to provide transient cooling results using the modeling and analyses described above. In one embodiment, the computer system solution may be based on the use of Microsoft Excel, while in another embodiment, the solution may be based on the Crystal XCelsius based software program. Information describing the data center to be analyzed input by a user may include room geometry, power and cooling system characteristics and a description of the chilled water system. The information required by the system may be easily obtained from nameplate values, readings, simple measurements, and assumptions.

FIG. 5 shows a data entry screen 500 that may be used with one embodiment to allow a user to enter and manipulate data to obtain and optimize the transient cooling performance of a data center. The input screen 500 includes a number of data entry boxes in which the user enters data that describes the system. Further, the data entry screen 500 includes a section 510 in which a user is able to simply describe connections of IT equipment and cooling equipment to uninterruptible power supplies (UPS) and generators as well as the predicted runtime of the UPS.

In at least one embodiment, calculations are run in real-time as the user enters or changes data in the entry boxes of the input screen 500 with results also shown in real-time. The ability to manipulate the data and view the results in real-time allows a user to easily consider tradeoffs when designing or upgrading a data center. This allows the user to design data infrastructures to make sure the required maximum allowable temperature of IT equipment will not be exceeded during power failure.

Figure 6:
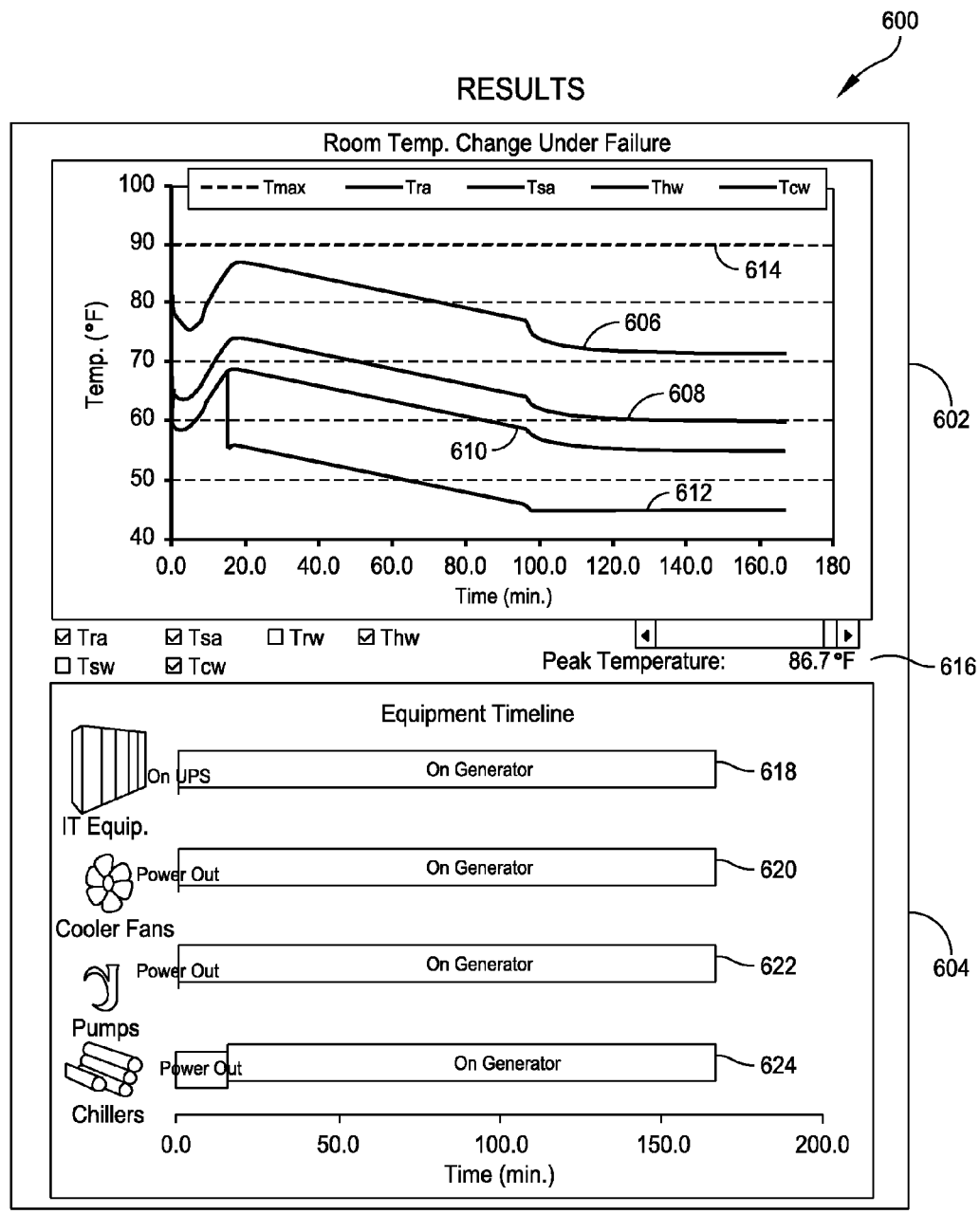
FIG. 6 shows a results screen that may be used in conjunction with a computer system in accordance with one embodiment.

FIG. 6 shows a results display screen 600 in accordance with one embodiment. The results screen may be updated whenever the input screen is completed or a change is made to data on the input screen. The results screen shown in FIG. 6 corresponds to the input data used in FIG. 5. The display screen has two major segments including a temperature graph segment 602 and an equipment timeline segment 604. The temperature graph segment 602 provides plots of temperature versus time for several temperature values in the data center. In different embodiments, different temperature parameters may be plotted. For the embodiment shown in FIG. 6, four temperature plots are shown on the graph including $T_r^a$ (fully mixed room temperature) 606, $T_s^a$ (cooler supply air temperature) 608, $T_h^w$ (temperature of water flow entering chillers) 610, and $T_c^w$ (temperature of water flow leaving the chillers) 612. The graph also shows the maximum allowable temperature for the room $T_{max}$ 614 which is set at 90 degrees. As shown in the graph, the temperature of the room increases immediately when the power goes out since the IT equipment is running on UPS, but the fans, pumps and chillers are not running Once the generator comes on (after 35 seconds, see FIG. 5), the temperature begins to come down, due to the "powering on" of the fans and pumps, which allows the thermal mass of the water in the pipes and storage tanks to be utilized, but the room temperature then increases since the chillers remain off for fifteen minutes and the water circulated in the system will be eventually warmed up. A short time after the chillers come on the temperature in the room comes down and stabilizes.

The results screen 600 shows in box 616 that the maximum temperature reached during a power outage for the data center corresponding to the input data in FIG. 5 will be 86.7 degrees, which is less than the maximum allowable temperature of 90 degrees, and occurs about twenty minutes after the power outage.

The equipment timeline segment 604 includes four timelines including an IT equipment timeline 618, a cooler fans timeline 620, a pumps timeline 622, and a chillers timeline 624. The timelines indicate the time that the corresponding equipment is powered on and the source of power, and corresponds with the information entered in the table on the bottom of the input screen 500 of FIG. 5.

In another embodiment, the transient temperature performance processes and tools described above are incorporated into a data center design system such as those described above. The stand-alone tool described above (including input screen 500 and results screen 600) may be built on any data center design platform, including a web-based software tool. When incorporated in a design system, input parameters may be available from information stored in a database, and less information may be required to be input by a user.

Data center, designers are always facing a number of tradeoffs, including decisions as to whether to connect cooler fans and chilled water pumps to a UPS. When the cooler fans and pumps are connected to a UPS, larger UPS capacity will be required to maintain the same runtime increasing the costs for the UPS. However, if cooler fans and chilled water pumps are not connected to UPS systems, there will be an initial spike in room temperature following a power outage which may exceed the maximum allowable data center operating temperature. Therefore, it is imperative for designers to determine whether or not to connect cooler fans and chilled water pumps to UPS systems. The tools and processes described herein allow the designer to make intelligent decisions that result in uninterruptible cooling without unnecessary costs.

Data center designers typically will take advantage of the stored cooling capacity such as that provided by chilled water storage tanks to improve transient cooling performance. The chilled water storage tanks serve as a thermal flywheel to maintain cooling after power failure and before the chiller system is powered back on by the emergency generators. The tools described herein can predict the required stored cooling capacity such as the size of the storage tank given the specified room temperature limits. In addition, the data center redundancy estimation can take into account the thermal transient time margin as well. The calculated metrics provided by the tools, such as the cooling runtime, can be an important factor to refine the accuracy of the data center system availability prediction.

Moreover, when performing data center energy saving calculations, thermal transient time margin is an additional constraint to consider. Typically, system configurations, such as chilled water supply set point temperature, need to be optimized to save energy. Any adjustment may have significant impacts on the thermal transient performance of the data center and can to be taken into account in data center design systems incorporating the tools described herein.

Figure 7:
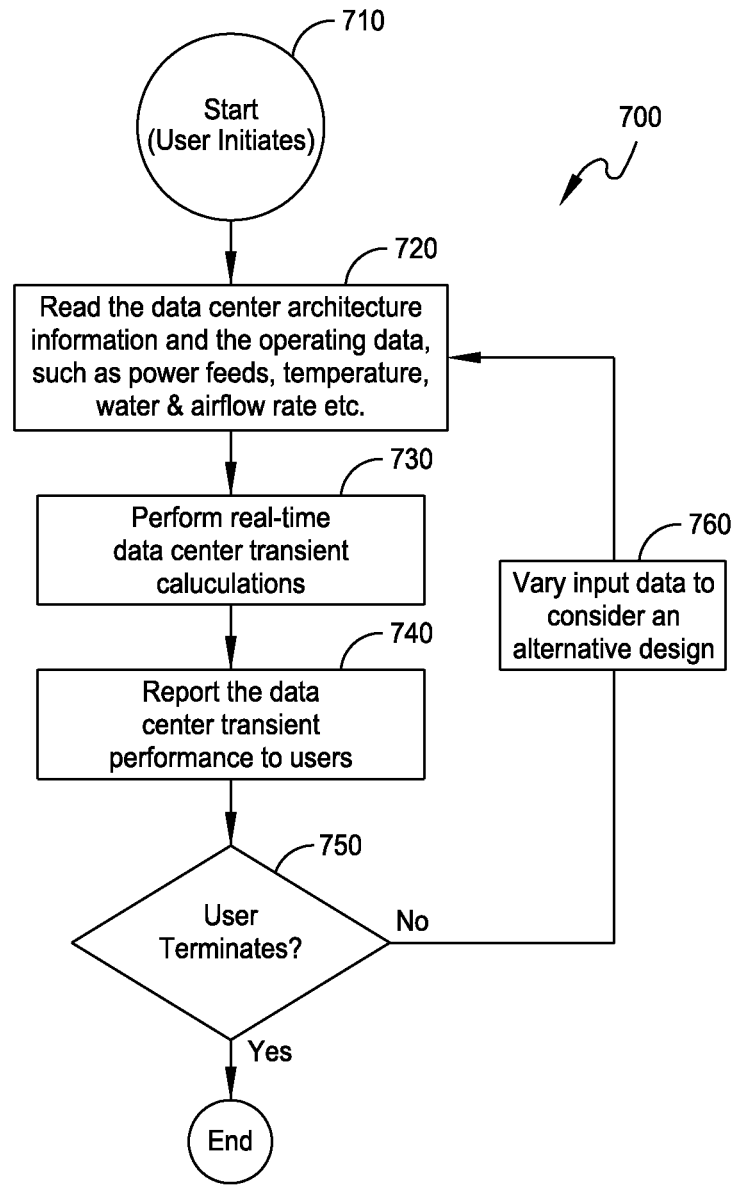
FIG. 7 is a flow chart of a first process in accordance with on embodiment.

A process 700 in accordance with one embodiment that may be incorporated into a data center design system for predicting transient cooling performance of the data center will now be described with reference to FIG. 7, which shows a flow chart of the process 700. In a first act 710 of the process, the user initiates the process by, for example, selecting an option incorporated on a display screen of the data center design system. Next, at act 720, the system reads the data center architecture information and operating data from storage in the system, and in addition, the user may be asked to input additional data. At act 730, the system performs real-time data center transient calculations using one of the processes described above, and at act 740, the results are displayed using, for example, the results screen 600 discussed above. At decision block 750, the user is given the option of terminating the process if the results are satisfactory, or at block 750, the user may indicate that further reconfiguration of the data center is desired. If further reconfiguration is desired, then at act 760, the data can be manipulated to attempt to optimize the design, and acts 720 to 760 are then repeated.

In another embodiment, the transient temperature performance processes and tools described above are incorporated into a data center management system such as APC's InfrastruXure® Central and Operations Manager product. Data center management systems provide data center managers and operators with the ability to monitor their data center. The systems obtain real time measured data such as power, temperature, water and air flow rates, as well as data center physical layouts and configurations, etc. With the incorporation of tools and processes discussed herein, a data center management system in accordance with one embodiment can determine transient cooling performance based on the data available in the system to predict metrics such as the cooling runtime and maximum predicted room temperature following an outage in real time. Any change made to a data center's cooling configuration is identified by the system and changes to the transient cooling performance of the data center can be quickly identified and called to the attention of an operator.

In one embodiment, the system can automatically update the transient cooling performance of the data center and issue alarms to inform the operators if the required thermal transient time margin may not be met. The system also provides recommendations to data center managers for improving the performance of a data center that is not meeting requirements. The recommendations may include, for example, to increase the stored cooling capacity or to connect cooler fans to the UPS systems etc.

Figure 8:
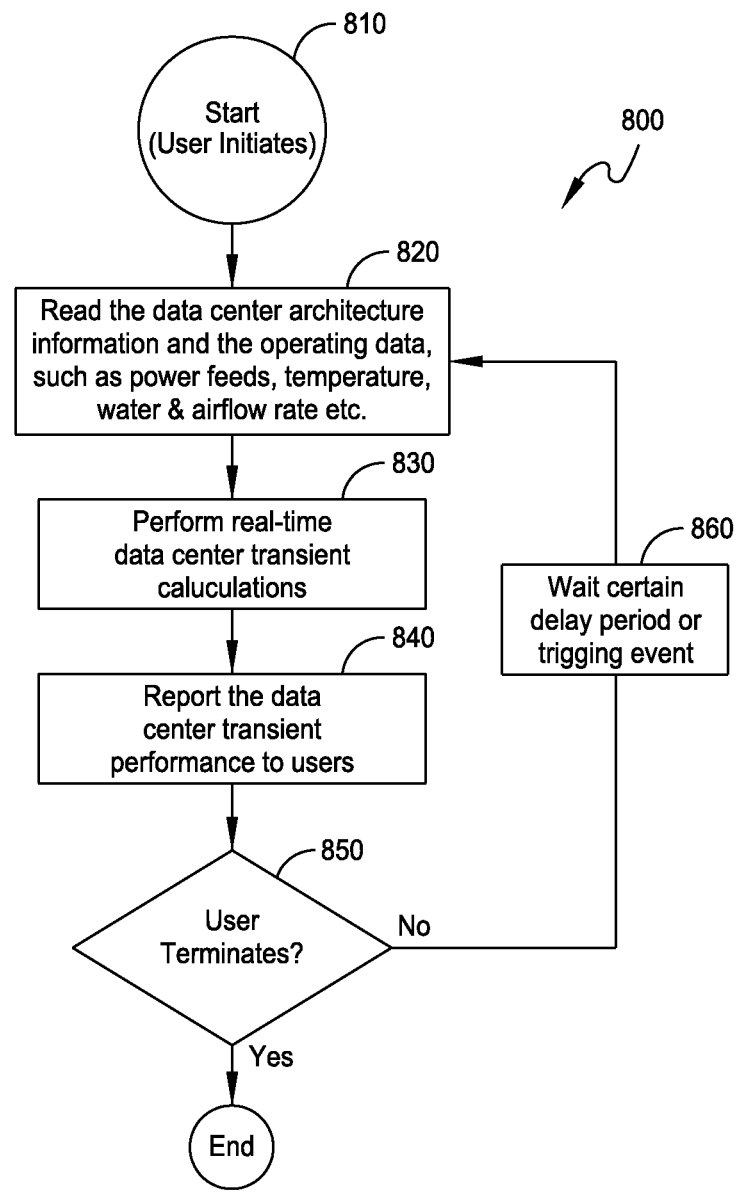
FIG. 8 is a flow chart of a second process in accordance with one embodiment.

A process 800 in accordance with one embodiment that may be incorporated into a data center management system for predicting transient cooling performance of the data center will now be described with reference to FIG. 8, which shows a flow chart of the process 800. In a first act 810 of the process, the user initiates the process by, for example, selecting an option incorporated on a display screen of the data center management system. Next, at act 820, the system reads the data center architecture information and operating data from storage in the system, and may also obtain data from sensors and other instruments located in the data center, and, in addition, the user may be asked to input additional data. At act 830, the system performs real-time data center transient calculations using one of the processes described above, and at act 840, the results are displayed using, for example, the results screen 600 discussed above. At decision block 850, the user is given the option of terminating the process. If the process is not terminated at block 850, the user may implement changes to improve or optimize the transient cooling performance, and then at act 860, cause the system to rerun the transient cooling analysis. In one embodiment, the process remains at act 860 unless the operator causes the system to proceed to act 820, or the system can detect a change in a data center parameter and automatically return to act 820 and recalculate the transient cooling performance. The parameters monitored for change may include a number of parameters including power draw, room temperature, cooling system settings and measurements such as temperature of chilled water. Further, in at least one embodiment, the system is configured to measure a maximum temperature that occurs in the data center following a power outage, compare the measured value with a predicted value and provide an indication to the operator if the measured differs from the threshold by more than a predetermined threshold. Still further, in at least one embodiment, the data center management system provides control signals to one or more devices in the data center to alter cooling parameters in the data center based on a predicted maximum temperature level. The control signals may, for example, be configured to alter parameters of one or more cooling devices or power distribution devices, including controlling power switches and cooling valves.

In at least some embodiments of the invention discussed herein, the performance of assessments and calculations in real-time refers to processes that are completed in a matter of a few seconds or less rather than several minutes or longer as can happen with complex calculations, such as those involving typical CFD calculations.

In at least some embodiments described above, the design of a data center and/or actual parameters in a data center are altered based on predicted transient cooling performance of a data center. The alterations may be implemented to improve the cooling performance and/or may be implemented to provide cost and/or power savings when the performance is found to be within predetermined specifications.

In at least some embodiments described above, tools and processes are provided for determining transient cooling performance of a data center. In other embodiments, the tools and processes may be used in other types of facilities, and may also be used in mobile applications, including mobile data centers.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-implemented method for evaluating transient cooling performance of a data center, the method comprising:
   receiving input data from a storage device, the input data including data center architecture information and operating data;
   performing real-time transient cooling performance calculations for the data center using the input data, the real-time transient cooling performance calculations include calculating a rate of change of at least one predicted temperature in the data center during a power outage of the data center; and
   displaying results of the real-time transient cooling performance calculations in a data center management system, wherein the results include a maximum predicted temperature of the data center following the power outage of the data center.

2. The computer-implemented method of claim 1, wherein the results include a graphical representation of data center temperature verses time for a time period following the power outage of the data center.

3. The computer-implemented method of claim 1, further comprising:
   comparing the maximum predicted temperature of the data center with a threshold to obtain a comparison result; and
   controlling at least one device in the data center based on the comparison result.

4. The computer-implemented method of claim 1, further comprising
   comparing the maximum predicted temperature of the data center with a threshold to obtain a comparison result;
   altering design parameters of the data center based on the comparison result; and
   performing a second iteration of real-time transient cooling performance calculations using the altered design parameters.

5. The computer-implemented method of claim 1, further comprising:
   detecting a change in at least one cooling parameter in the data center; and performing a second iteration of real-time transient cooling performance calculations using the at least one cooling parameter.

6. The computer-implemented method of claim 1, further comprising:
comparing the maximum predicted temperature of the data center with a threshold to obtain a comparison result; and
providing a warning to an operator based on the comparison result.

7. The computer-implemented method of claim 1, wherein performing real-time transient cooling performance calculations for the data center includes developing a set of energy balance and heat transfer linear equations for the data center based on the input data, and generating a symbolic expression for each of a plurality of temperature variables in the set of energy balance linear equations.

8. The computer-implemented method of claim 3, wherein the data center includes at least one uninterruptible power supply, and wherein the method includes altering a connection of cooling equipment to the uninterruptible power supply based on the comparison result.

9. A system for evaluating transient cooling performance of a data center, the system comprising:
a storage device;
a display;
a controller coupled to the storage device and the display and configured to:
receive input data from the storage device, the input data including data center architecture information and operating data;
perform real-time transient cooling performance calculations for the data center using the input data, the real-time transient cooling performance calculations include calculating a rate of change of at least one predicted temperature in the data center during a power outage of the data center; and
control the display to display results of the real-time transient cooling performance calculations in a data center management system, wherein the results include a maximum predicted temperature of the data center following the power outage of the data center.

10. The system of claim 9, wherein the results include a graphical representation of data center temperature verses time for a time period following the power outage of the data center.

11. The system of claim 9, wherein the controller is further configured to:
compare the maximum predicted temperature of the data center with a threshold to obtain a comparison result; and
control at least one device in the data center based on the comparison result.

12. The system of claim 9, wherein the controller is further configured to:
compare the maximum predicted temperature of the data center with a threshold to obtain a comparison result;
alter design parameters of the data center based on the comparison result; and
perform a second iteration of real-time transient cooling performance calculations using the altered design parameters.

13. The system of claim 9, wherein the controller is further configured to:
detect a change in at least one cooling parameter in the data center; and
perform a second iteration of real-time transient cooling performance calculations using the at least one cooling parameter.

14. The system of claim 9, wherein the controller is further configured to:
compare the maximum predicted temperature of the data center with a threshold to obtain a comparison result; and
provide a warning to an operator based on the comparison result.

15. The system of claim 9, wherein the controller is configured to perform real-time transient cooling performance calculations for the data center by developing a set of energy balance and heat transfer linear equations for the data center based on the input data, and generating a symbolic expression for each of a plurality of temperature variables in the set of energy balance linear equations.

16. A non-transitory computer readable medium having stored thereon sequences of instruction including instructions that will cause a processor to:
receive input data regarding a layout of a data center and cooling systems contained in the data center;
store the input data;
perform real-time transient cooling performance calculations for the data center using the input data, the real-time transient cooling performance calculations include calculating a rate of change of at least one predicted temperature in the data center during a power outage of the data center; and
control a display to display results of the real-time transient cooling performance calculations in a data center management system, wherein the results include a maximum predicted temperature of the data center following the power outage of the data center.

17. The non-transitory computer readable medium of claim 16, wherein the sequences of instruction further include instructions that will cause the processor to determine a maximum temperature of the data center following a power outage.

18. The non-transitory computer readable medium of claim 17, wherein the sequences of instruction further include instructions that will cause the processor to:
compare the maximum predicted temperature of the data center with a threshold to obtain a comparison result; and
control at least one device in the data center based on the comparison result.

19. The non-transitory computer readable medium of claim 17, wherein the sequences of instruction further include instructions that will cause the processor to:
compare the maximum predicted temperature of the data center with a threshold to obtain a comparison result;
alter design parameters of the data center based on the comparison result; and
perform a second iteration of real-time transient cooling performance calculations using the altered design parameters.

20. The non-transitory computer readable medium of claim 16, wherein the sequences of instruction further include instructions that will cause the processor to compare the maximum predicted temperature of the data center with a threshold to obtain a comparison result, and provide a warning to an operator based on the comparison result.

* * * * *